(12) United States Patent
Buchberger

(10) Patent No.: US 6,951,984 B2
(45) Date of Patent: Oct. 4, 2005

(54) CABLE BUSHING THROUGH A SHIELDING WALL

(75) Inventor: Georg Buchberger, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/291,741

(22) Filed: Nov. 12, 2002

(65) Prior Publication Data

US 2003/0111248 A1 Jun. 19, 2003

(30) Foreign Application Priority Data

Nov. 12, 2001  (DE) ......................................... 101 55 434

(51) Int. Cl.$^7$ ................................................. H02G 3/18
(52) U.S. Cl. ............... 174/65 R; 174/65 G; 174/153 G; 248/56; 16/2.1
(58) Field of Search ............................. 174/65 R, 65 G, 174/152 G, 153 G; 248/56; 16/2.1, 2.2

(56) References Cited

U.S. PATENT DOCUMENTS

| | | | | | |
|---|---|---|---|---|---|
| 4,224,465 | A | * | 9/1980 | Ruzic | ........................... 174/135 |
| 4,306,698 | A | * | 12/1981 | Gonia et al. | ............... 248/74.1 |
| 5,410,102 | A | * | 4/1995 | Guiol et al. | .............. 174/35 C |
| 5,676,339 | A | * | 10/1997 | Simon | ........................... 248/56 |
| 6,235,987 | B1 | * | 5/2001 | Gamaggio-Schafer | . 174/40 CC |
| 6,459,040 | B2 | * | 10/2002 | Teunisse et al. | .......... 174/65 R |

* cited by examiner

Primary Examiner—Dhiru R. Patel
(74) Attorney, Agent, or Firm—Staas & Halsey LLP

(57) ABSTRACT

Contact-making and attachment structures for a cable bushing through an opening in a shielding wall are arranged on two mutually opposite opening edges, to make contact with and attach a cable to be passed through, on the two opposite opening edges. The opening is thus, to a certain extent, bridged by the installed cable, thus reducing any adverse effect on the shielding effect caused by the opening.

16 Claims, 1 Drawing Sheet

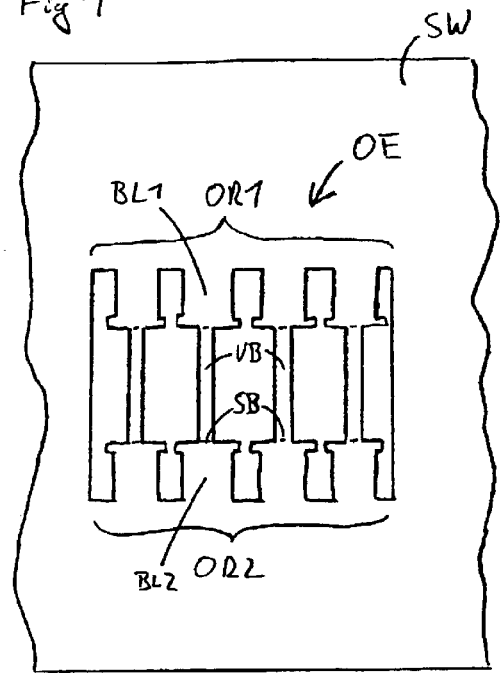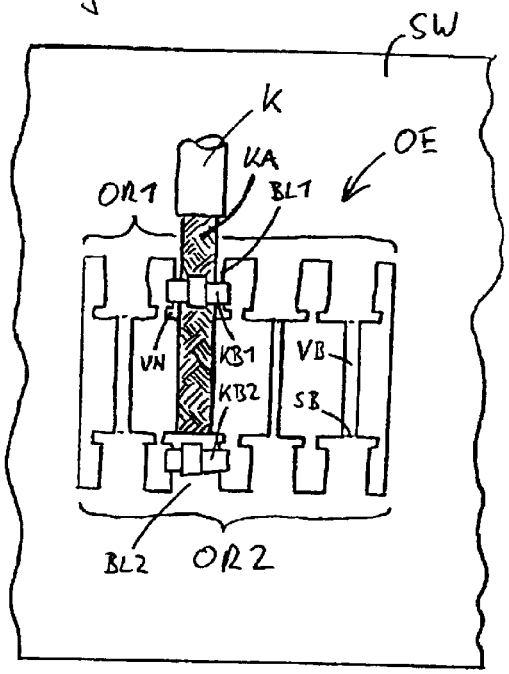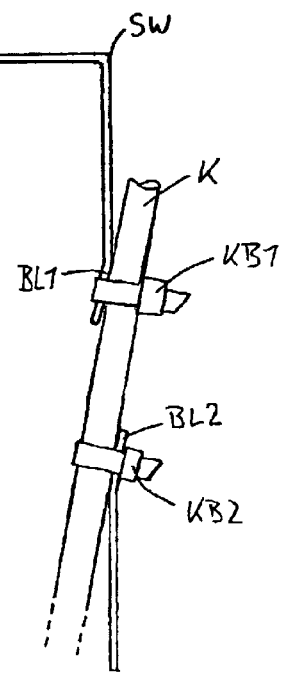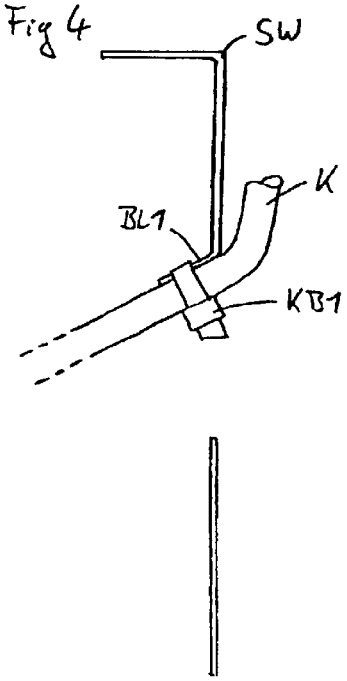

CABLE BUSHING THROUGH A SHIELDING WALL

CROSS REFERENCE TO RELATED APPLICATIONS

This application is based on and hereby claims priority to German Application No. 101 55 434.6 filed on Nov. 12, 2001, the contents of which are hereby incorporated by reference.

BACKGROUND OF THE INVENTION

Electromagnetic shielding of appliances or assemblies is becoming increasingly important for development of electrical appliances with a high layer density and very high operating frequencies, owing to the increase associated with this in electromagnetic interference fields within and outside the electrical appliances.

Shielding housings or shielding walls are generally provided for electromagnetic shielding. However, in general, openings for cables to pass through are required in such shielding housings or shielding walls, and these adversely affect the shielding effect. In general, relatively large openings have to be provided so that it is also possible to pass through a cable plug, which is large in comparison to the cable diameter, together with a cable. The larger the opening, the greater the extent to which the shielding effect is also reduced, however. With circular openings, the reduction in the shielding effect is governed essentially by their diameter, while with rectangular openings, it is governed essentially by their diagonals. This thus results in the problem of designing such an opening firstly to be sufficiently large for cable plugs to be passed through with ease while, on the other hand, to be sufficiently small to maintain an adequate shielding effect.

In practice, openings which are originally designed to be large are frequently subsequently reduced in size by covers which have to be fitted after a cable has been passed through. However, this involves additional material costs and assembly effort.

SUMMARY OF THE INVENTION

An object of the present invention is to specify a cable bushing which has a good shielding effect and involves only a small amount of assembly effort to pass a cable through.

This object is achieved by a cable bushing through an opening in a shielding wall which has structures to contact and attach, on two mutually opposite opening edges, to a cable passed through on the two opposite opening edges. The opening is bridged to a certain extent by the installed cable, as a result of which an opening diagonal or an opening diameter is reduced in size by the cable itself. In this way, any adverse effect on the shielding effect caused by the opening is reduced without any additional material costs and with little assembly effort. This is particularly advantageous for openings whose diameter or diagonals are considerably larger than the cable diameter.

According to one advantageous embodiment of the invention, contact-making and attachment means can be arranged such that the installed cable essentially connects the two opposite opening edges along their length. This allows relatively large openings to be bridged by the cable.

Furthermore, the contact-making means may be designed such that they make it possible to make contact with a cable shield, which rests on the cable, on the two opposite opening edges. Contact can in this case preferably be made by the contact-making means touching the cable shield, which is exposed in places.

According to a further advantageous embodiment the attachment means may themselves be in the form of contact-making means. The attachment means can be designed to be conductive, at least in places, for this purpose. Attachment lugs can preferably be arranged, as the attachment means, on the opposite opening edges. The attachment lugs may be conductive, at least in places, to make contact with the cable and/or with its cable shield.

The attachment lugs may be designed to be flexible, for example, to make it easier for one or more cables to be passed through or installed.

Furthermore, the attachment lugs may be formed integrally from the shielding wall, for example by stamping out. As an alternative to this, attachment lugs which are attached to the opening edge can be provided retrospectively, being composed, for example, of thinner and more flexible sheet metal than the shielding wall.

Furthermore, cable ties are provided as part of the attachment means for tying the cable to the attachment lugs of the two opposite opening edges. The attachment lugs may in this case preferably be provided with projecting tabs or hooks, to make it more difficult for the cable ties to slide off.

Furthermore, the contact-making and attachment means on a first of the opposite opening edges are designed for making contact with and attachment of the cable to a front or outer face of the shielding wall, and on a second of the opposite opening edges are designed for making contact with and attachment of the cable to a rear or inner face of the shielding wall. This makes it possible to pass the cable obliquely through the opening.

According to one advantageous development of the invention, at least one connecting web, which can be knocked out, can be arranged between the opposite opening edges, to shield a part of the opening which is not used for passing through a cable. The connecting web may preferably be arranged between attachment lugs and, furthermore, may be connected to them via a weak point.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIG. 1 is a plan view of an unused cable bushing,

FIG. 2 is a plan view of the cable bushing with a cable passed through it,

FIG. 3 is a side view of the cable bushing with a cable passed through it, and

FIG. 4 is a side view of the cable bushing while a cable is being passed through.

DETAILED DESCRIPTION OF THE PREFERRED EMBODIMENT

Reference will now be made in detail to the preferred embodiments of the present invention, examples of which are illustrated in the accompanying drawings, wherein like reference numerals refer to like elements throughout.

FIGS. 1 and 2 each shown a plan view of a shielding wall SW, for example a rear wall of a metallic appliance housing with an opening OE for cables to pass through. The opening OE is provided on two opposite opening edges OR1 and OR2 with attachment lugs BL1 and BL2 which project into the opening OE and are electrically conductive and flexible. In the present exemplary embodiment, four attachment lugs BL1 are provided on the opening edge OR1 and four attachment lugs BL2, which are opposite the attachment lugs BL1, are provided on the opening edge OR2. For clarity, only two opposite attachment lugs BL1 and BL2 are provided with a reference symbol. The opening OE is designed to be sufficiently large that four cables can be passed through, as well as the associated cable plugs. In particular, the distance between opposite attachment lugs BL1 and BL2 is considerably larger than the cable diameter of the cables to be passed through.

FIG. 1 shows an unused cable bushing, in which no cable has been passed through the opening OE. In this case, opposite attachment lugs BL1 and BL2 are in each case electrically conductively connected by connecting webs VB which can be knocked out. The conductive connection of the opposite attachment lugs BL1 and BL2 reduces the size of the diagonal of the opening OE which is the governing factor for the adverse effect on the shielding effect.

Weak points SB are in each case provided between the connecting webs VB and the attachment lugs BL1 and BL2 to make it possible to knock out a respective connecting web VB when required, that is to say when a cable is being passed through, in a convenient manner.

For clarity reasons, only some of the connecting webs VB and weak points SB are identified by reference symbols in FIGS. 1 and 2.

FIG. 2 shows the cable bushing after a cable K has been passed through and attached. The cable K is attached to two opposite attachment lugs BL1 and BL2, between which the connecting web VB has previously been knocked out. In the following text, the reference symbols BL1 and BL2 are now used only for those attachment lugs BL1 and BL2 to which the cable K is attached. A cable shield KA of the cable K is exposed by removal of the cable insulation over a length which corresponds approximately to the distance between one of the opening edges OR1 and OR2 and the opposite attachment lugs BL1 and BL2. In the area of the exposed cable shield KA, the cable K is firmly connected by a cable tie KB1 to the front face of the attachment lug BL1, and by a cable tie KB2 to the rear face of the attachment lug BL2. The front face and rear face of the attachment lugs BL1 and BL2 in this case relate to the front face and rear face of the shielding wall SW. The exposed cable shield KA is pressed against the respective attachment lugs BL1 and BL2 by the firmly tightened cable ties KB1 and KB2. Since the attachment lugs BL1 and BL2 are conductive, contact is made with the cable shield KA at contact-making points which are separated from one another, by touching the attachment lugs BL1 and BL2. Apart from the exposure of the cable shield KA, no further action is required on the cable shield KA or on the cable for this purpose. The relevant attachment lugs BL1 and BL2 thus act both as attachment means and as contact-making means for the cable K. A respective contact-making point is located on the front face of the attachment lug BL1 and on the rear face of the attachment lug BL2.

As illustrated in FIGS. 2 and 3, the cable shield KA of the attached cable K connects the opposite attachment lugs BL1 and BL2 and the opposite opening edges OR1 and OR2 in an electrically conductive manner across a largest opening dimension or length, instead of the connecting web that has been knocked out. This avoids increasing the size of the opening diagonals, which govern the adverse effect of the shielding effect. The shielding function of the knocked-out connecting web is thus carried out by that section of the cable shield KA which bridges the opening OE.

On the opening side, the attachment lugs BL1 and BL2 are provided with projecting tabs VN to prevent the cable ties KB1 and KB2 which secure the cable K from sliding off the attachment lugs BL1 and BL2.

FIG. 3 shows a side view of the cable bushing with a cable K passed through it. The reference symbols indicated in FIG. 3 in each case have the same meanings as in all the other figures. FIG. 3 shows the oblique cable routing of the cable K through the opening OE. The oblique cable routing is assisted by the flexibility of the attachment lugs BL1 and BL2, which are slightly bent—resting parallel on the cable K.

Finally, FIG. 4 shows a side view of the cable bushing with a cable K being passed through. In order to pass the cable K through the cable bushing, the cable is first of all firmly tied to the front face of the attachment lug BL1 by the cable tie KB1. The processes of passing the cable K through and firmly tying it are in this case made considerably easier by the flexibility of the attachment lug BL1,—as indicated in FIG. 4. The flexible attachment lugs BL1 and BL2 mean that the opening OE can be designed to be smaller overall, thus having an advantageous effect on the shielding effect. Once the cable K has been firmly tied to the attachment lug BL1, the cable K is also firmly tied to the attachment lug BL2 by the cable tie KB2, as illustrated in FIGS. 2 and 3.

The invention has been described in detail with particular reference to preferred embodiments thereof and examples, but it will be understood that variations and modifications can be effected within the spirit and scope of the invention.

What is claimed is:

1. A cable bushing for a cable through an opening in a shielding wall, comprising:
   contact-making means and attachment means, arranged on two mutually opposite opening edges of the shielding wall, for making electrical and physical contact with and attachment to the cable to be passed through on the two mutually opposite opening edges utilizing cable ties for tying the cable thereto.

2. The cable bushing as claimed in claim 1, wherein the cable essentially connects the two mutually opposite opening edges across a largest opening dimension.

3. The cable bushing as claimed in claim 2, wherein said contact-making means provide means for making contact with a cable shield of the cable, on the two mutually opposite opening edges.

4. The cable bushing as claimed in claim 3, wherein said contact-making means and said attachment means are provided by integrated structures, one on each of the two mutually opposite opening edges.

5. The cable bushing as claimed in claim 4, wherein said contact-making means and said attachment means include attachment lugs, one on each of the two mutually opposite opening edges.

6. The cable bushing as claimed in claim 5, wherein the attachment lugs are flexible.

7. The cable bushing as claimed in claim 6, wherein the attachment lugs are integral projections from the shielding wall.

8. The cable bushing as claimed in claim 1, wherein said contact-making and attachment means comprise:
   a first integral structure on a first of the two mutually opposite opening edges to make contact with and attach to the cable on an outer face of the shielding wall, and a second integral structure on a second of the two mutually opposite opening edges to make contact with and attach to the cable on an inner face of the shielding wall.

9. The cable bushing as claimed in clean 8, further comprising at least one electrically conductive connecting web, arranged between the two mutually opposite opening edges and knocked out to make space for the cable, to provide shielding for at least a part of the opening between the two mutually opposite opening edges when no cable is connected therebetween.

10. The cable bushing as claimed in claim 9, wherein a plurality of pairs of attachment lugs are arranged on each of the two mutually opposite opening edges and one of said at least one electrically conductive connecting web remains attached to each pair of said attachment lugs not attached to any cables.

11. A cable bushing for at least one cable through an opening in a shielding wall, comprising:

attachment lugs with projection tabs, integral with and extending from mutually opposite opening edges of the shielding wall, formed to secure cable ties tying the at least one cable to said attachment lugs to maintain the at least one cable passed through the opening in contact with said attachment lugs and each of the mutually opposite opening edges.

12. The cable bushing as claimed in claim 11, wherein the at least one cable essentially connects the opposite opening edges across a largest opening dimension.

13. The cable bushing as claimed in claim 12, wherein said attachment lugs are flexible.

14. The cable bushing as claimed in claim 11, wherein a plurality of pairs of said attachment lugs are formed with one of each pair on each of the opposite opening edges.

15. The cable bushing as claimed in claim 14, further comprising a plurality of electrically conductive connecting webs, each connecting a corresponding pair of said attachment lugs and easily knocked out to make space for the at least one cable, to provide shielding for at least a part of the opening between the corresponding pair of said attachment lugs when no cable is connected there between.

16. The cable bushing as claimed in claim 15, wherein a first one of each pair of said attachment lugs makes contact with and attaches to the at least one cable on an outer face of the shielding wall and a second one of each pair of said attachment lugs makes contact with and attaches to the at least one cable on an inner face of the shielding wall.

* * * * *